US009039219B2

(12) United States Patent
Uchimi

(10) Patent No.: US 9,039,219 B2
(45) Date of Patent: May 26, 2015

(54) DISPLAY APPARATUS

(71) Applicant: CANON KABUSHIKI KAISHA, Tokyo (JP)

(72) Inventor: Tasuku Uchimi, Chigasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 137 days.

(21) Appl. No.: 13/796,840

(22) Filed: Mar. 12, 2013

(65) Prior Publication Data
US 2013/0242542 A1 Sep. 19, 2013

(30) Foreign Application Priority Data

Mar. 19, 2012 (JP) ................................ 2012-062250
Jan. 29, 2013 (JP) ................................ 2013-013830

(51) Int. Cl.
G09F 13/04 (2006.01)
F21V 29/02 (2006.01)
H05K 7/20 (2006.01)

(52) U.S. Cl.
CPC .......... F21V 29/027 (2013.01); H05K 7/20136 (2013.01); H05K 7/20972 (2013.01)

(58) Field of Classification Search
CPC .......................... F21V 29/027; H05K 7/20136
USPC ............................................... 362/97.1, 97.2
See application file for complete search history.

(56) References Cited

U.S. PATENT DOCUMENTS

2010/0177479 A1* 7/2010 Itazawa et al. ................ 361/694

FOREIGN PATENT DOCUMENTS

JP 2010-160443 7/2010

* cited by examiner

Primary Examiner — Vip Patel
(74) Attorney, Agent, or Firm — Cowan, Liebowitz & Latman, P.C.

(57) ABSTRACT

A display apparatus includes a display unit; a chassis member provided at the rear side of the display unit; a fan attached to the chassis member; a first circuit substrate that is provided between the display unit and the chassis member and of which the component-mounting surface is arranged at a position facing the fan side; and a second circuit substrate that is provided between the display unit and the chassis member and of which the component-mounting surface is arranged to face the display unit side.

22 Claims, 7 Drawing Sheets

US 9,039,219 B2

DISPLAY APPARATUS

BACKGROUND OF THE INVENTION

1. Field of the Invention

The present invention relates to a substrate layout and a heat dissipating structure of a display apparatus.

2. Description of the Related Art

In an image display apparatus using a liquid crystal panel, a light-emitting body illuminates light from a rear face of a liquid crystal panel and an image is displayed on the liquid crystal panel using the transmitted light. As the light source of a backlight that irradiates a liquid crystal panel with light from the rear face thereof, a light-emitting diode (LED) is mainly used. Heat dissipation is important in order to prevent a reduction in luminous efficiency due to heating of an LED and a reduction in life. A heat dissipation countermeasure is also required for an LED driver. Thus, a space for dissipating the heat generated by an LED and its-mounting substrate into air and a space for dissipating the heat generated by a driver and its-mounting substrate are required. In other words, a sufficient space for heat dissipation needs to be ensured, which conflicts with a request for thinning the external shape of the apparatus.

As the substrate layout and the heat dissipating structure of a conventional image display apparatus, Japanese Patent Laid-Open No. 2010-160443 discloses a method for devising the layout of a circuit substrate that is arranged on a rear face of a display panel. FIG. 7 is a cross-sectional view illustrating the configuration of a conventional image display apparatus. A first circuit substrate 103 and a second circuit substrate 104 are arranged on the rear face of a display panel 100 such that these circuit substrates are arranged so as not to overlap each other. The component-mounting surface of the first circuit substrate 103 is arranged to face the display panel 100 (the front side) and the component-mounting surface of the second circuit substrate 104 is arranged to face the rear side of the display panel 100. The first circuit substrate 103 is arranged above the second circuit substrate 104, and a heat sink 105 is fixed to the component non-mounting surface of the first circuit substrate 103. The display panel 100 and the circuit substrates 103 and 104 are covered by a bezel 101 and a rear cover 102. Air flows from a heat dissipation hole (not shown) formed in the rear cover 102 into the interior of the housing in order to dissipate the heat generated by the circuit substrates 103 and 104. The air drawn from the lower part of the housing flows to both sides of the substrate so as to cool the second circuit substrate 104 and the air on the component non-mounting surface side flows upward toward the first circuit substrate 103. Also, the air on the component-mounting surface side of the second circuit substrate 104 is discharged from the upper part thereof to the exterior of the housing. The first circuit substrate 103 is cooled by air risen from the second circuit substrate 104 at the component-mounting surface side thereof. The portion on the component non-mounting surface side of the first circuit substrate 103 is cooled by air flowed from the central portion of the housing by means of the heat sink 105 fixed to the first circuit substrate 103, and the resulting air is discharged from the upper part of the housing. In this configuration, the component-mounting surfaces of the circuit substrates arranged in a top-bottom relationship are inverted to each other so that the air passage is split into two portions. Consequently, thinning an apparatus is achieved compatible with ensuring improvement in heat-dissipation performance.

In the configuration disclosed in Japanese Patent Laid-Open No. 2010-160443, thinning an apparatus and improvement in heat-dissipation performance can be expected when a heat dissipation countermeasure is taken by the natural convection of air without using a fan. However, in recent years, the heat quantity generated by a backlight LED which is used at the rear side of a liquid crystal panel is large, and thus, a heat dissipation countermeasure by use of forced convection using a fan is more efficient. In this case, a space is required for the fan.

When heat dissipation is performed using a fan in the structure shown in FIG. 7, it is necessary that the component-mounting surface of the first circuit substrate 103 arranged at the upper part faces the display panel side and the fan is arranged at the component non-mounting surface side. Consequently, a certain thickness is required for the housing.

SUMMARY OF THE INVENTION

Accordingly, the display apparatus of the present invention realizes thinning of the display apparatus while maintaining a heat-dissipation performance by use of a fan.

According to an aspect of the present invention, a display apparatus is provided that includes a display unit; a chassis member provided at the rear side of the display unit; a fan attached to the chassis member; a first circuit substrate that is provided between the display unit and the chassis member and of which the component-mounting surface is arranged at a position facing the fan side; and a second circuit substrate that is provided between the display unit and the chassis member and of which the component-mounting surface is arranged to face the display unit side.

According to the present invention, thinning of a display apparatus may be realized while maintaining a heat-dissipation performance by use of a fan.

Further features of the present invention will become apparent from the following description of exemplary embodiments with reference to the attached drawings.

DESCRIPTION OF THE EMBODIMENTS

Hereinafter, preferred embodiments of the present invention will be described with reference to the drawings. In the following embodiments, a description will be given of the configuration in which image display is performed using a backlight device as an exemplary display unit using a display panel and a light source unit.

(First Embodiment)

Figure 1A:
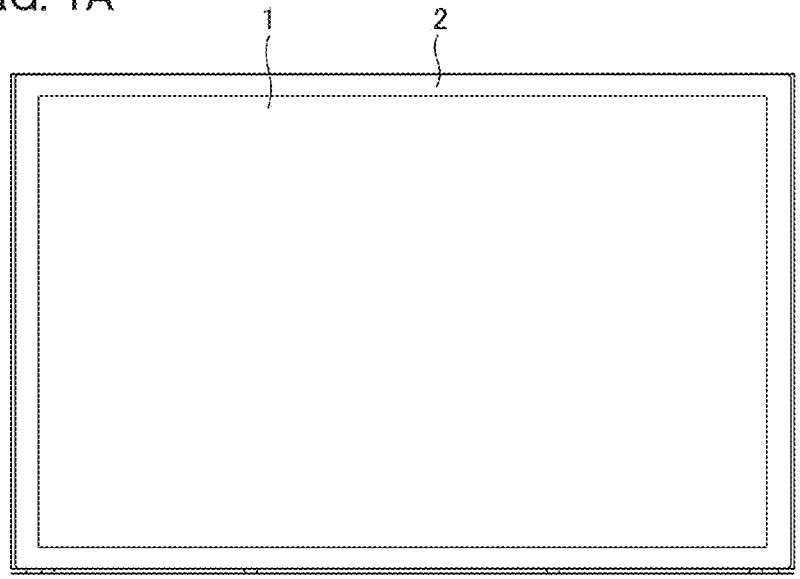
FIG. 1A is a front view A illustrating example of the configuration of an image display apparatus in order to explain a first embodiment of the present invention in conjunction with FIGS. 2 to 4.
Figure 1B:
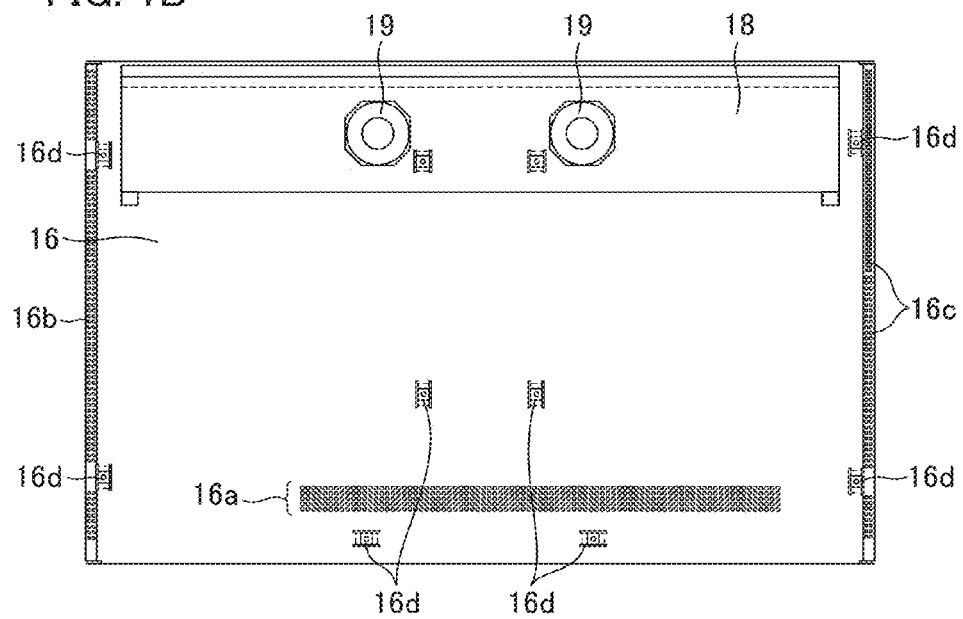
FIG. 1B is a rear view B of an image display apparatus shown in FIG. 1A.
Figure 2:
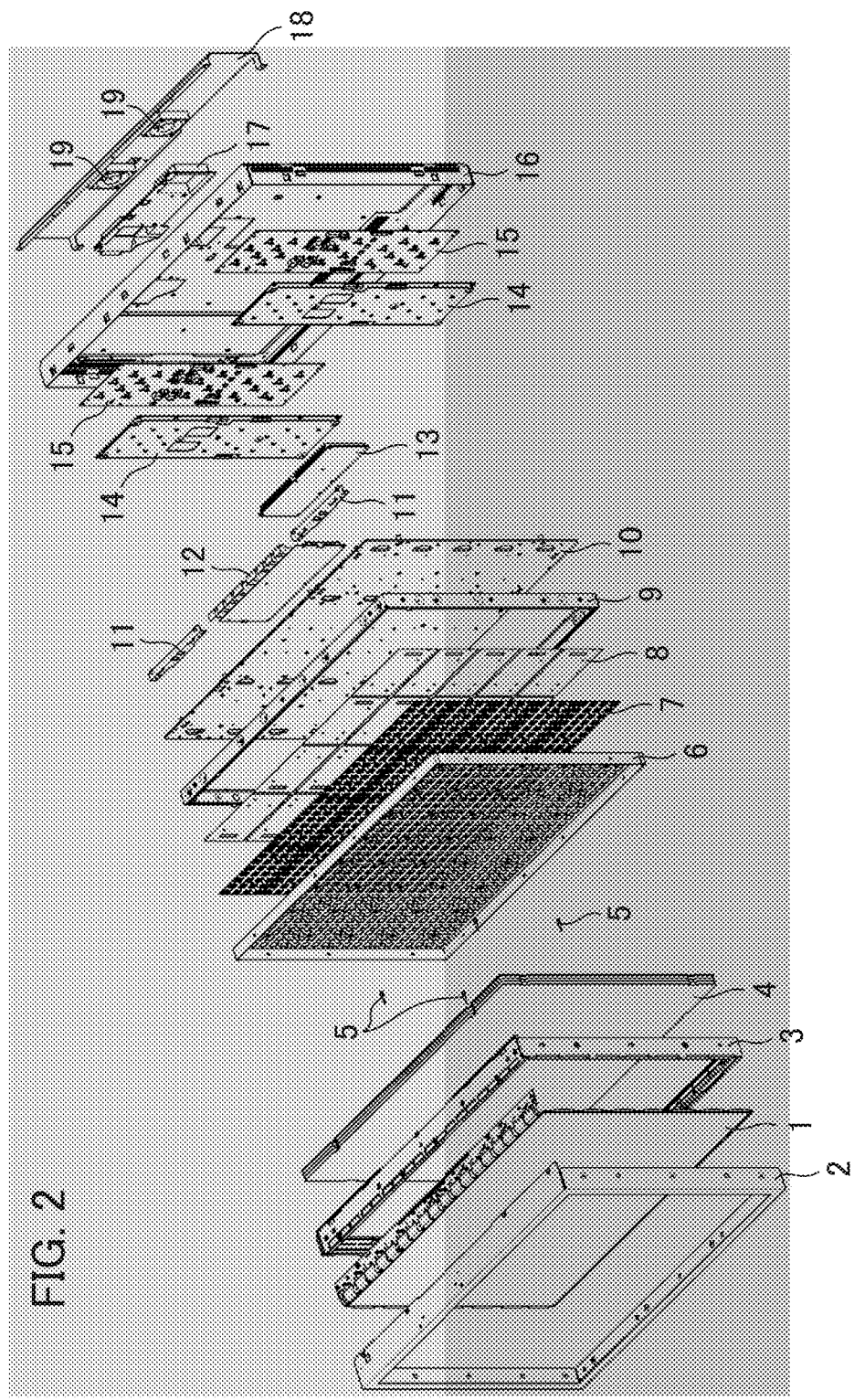
FIG. 2 is an exploded perspective view illustrating an image display apparatus.

FIG. 1A is a front view illustrating a display apparatus according to a first embodiment of the present invention and FIG. 1B is a rear view illustrating a display apparatus according to a first embodiment of the present invention. FIG. 2 is an exploded perspective view illustrating the display apparatus according to the first embodiment. In the following, a description will be given of a positional relation of each section by defining the upper face, the lower face, the right side face and the left side face when seen from the front of the display face of the apparatus by a user. An exemplary backlight configuration in which a display unit has a display panel and a light source unit which irradiates the display panel with light is shown.

As shown in FIG. 1A, the image display apparatus includes a liquid crystal panel 1 as a display panel, and the peripheral edges of the front face of the liquid crystal panel 1 are held by a frame 2 formed of a metal material or the like. As shown in FIG. 1B, a plurality of vent holes 16a, 16b, and 16c for taking air into the interior of the apparatus is provided on a chassis member (hereinafter simply referred to as "chassis") 16 that covers the frame 2 from the rear face thereof. The first vent holes 16a are arranged in the horizontal direction at the lower part of the chassis of the image display apparatus. The second vent holes 16b are arranged in the vertical direction at the left side part of the chassis of the image display apparatus as viewed from the rear face thereof. The third vent holes 16c are arranged in the vertical direction at the right side part of the chassis of the image display apparatus as viewed from the rear face thereof. A fan holder 18 is provided on the rear face of the chassis 16 and a plurality of fans 19 is fixed to the fan holder 18. Each of the fans 19 has a function that discharges air, which has been taken from a plurality of vent holes 16a, 16b, and 16c into the interior of the apparatus, to the exterior of the apparatus. The chassis 16 is fastened and fixed to the structure (not shown) provided in the apparatus by means of a plurality of screw fastening parts 16d.

Next, a description will be given of the configuration of an image display apparatus with reference to FIG. 2. The liquid crystal panel 1 is sandwiched between the frame 2 which is attached to the front side of the image display apparatus and a panel holder 3 which is attached to the rear side thereof. Optical sheets 4 are arranged at the rear face of the panel holder 3. A surface light source unit that irradiates the liquid crystal panel 1 with light from the rear side includes a substrate on which a plurality of light-emitting element is mounted. Light-emitting diodes (hereinafter referred to as "LEDs") are mounted on an LED substrate 7 in an array arrangement. The light emitted from each LED is diffused and converged through the optical sheets 4 to thereby reach the liquid crystal panel 1. A reflective sheet 6 and a plurality of spacers 5 are arranged on the front side of the LED substrate 7. The spacer 5 is a member that suppresses the warpage in the optical sheets 4.

A heat conductive sheet 8 is arranged on the rear face of the LED substrate 7, i.e., the component non-mounting surface and is further thermally connected to an LED heat sink 10 constituting a heat radiating portion. In other words, the heat generated by the LED substrate 7 is transferred to the LED heat sink 10 on the rear face via the heat conductive sheet 8. The LED heat sink 10 is fixed to a case 9 and the LED substrate 7 is arranged within the case 9 so that a backlight device is configured. A display control substrate 12 and a fixing bracket 11 for fixing the frame 2 are mounted on the rear face of the LED heat sink 10. The display control substrate 12 is a first circuit substrate that performs display control of the liquid crystal panel 1 and performs, for example, surface unevenness correction processing for the liquid crystal panel 1. The display control substrate 12 outputs a data line drive signal (Y direction) to the data line drive circuit of the liquid crystal panel 1 and outputs a gate line drive signal (X direction) to the gate line drive circuit of the liquid crystal panel 1. It should be noted that the display control substrate 12 may be a circuit substrate that performs image scaling (enlargement or reduction) processing or may also be a circuit substrate that performs gamma correction processing or noise reduction processing. Any circuit substrate that performs various types of image processing regarding display control is applicable to the display control substrate 12. Furthermore, an auxiliary heat sink 13, a plurality of LED driver substrates 15, and an LED driver heat sink 14 are arranged on the rear face of the LED heat sink 10. The LED driver substrate 15 is a second circuit substrate that drives a surface light source unit. A drive circuit section for driving LEDs on the LED substrate 7 is mounted on the LED driver substrate 15. The heat generated by the drive circuit section is subject to heat dissipation via the LED driver heat sink 14. A chassis 16 is fixed to the LED heat sink 10 from the rear face so as to cover these structures and a fan guide 17, a fan holder 18, and a plurality of fans 19 are further attached to the rear face.

Figure 3:
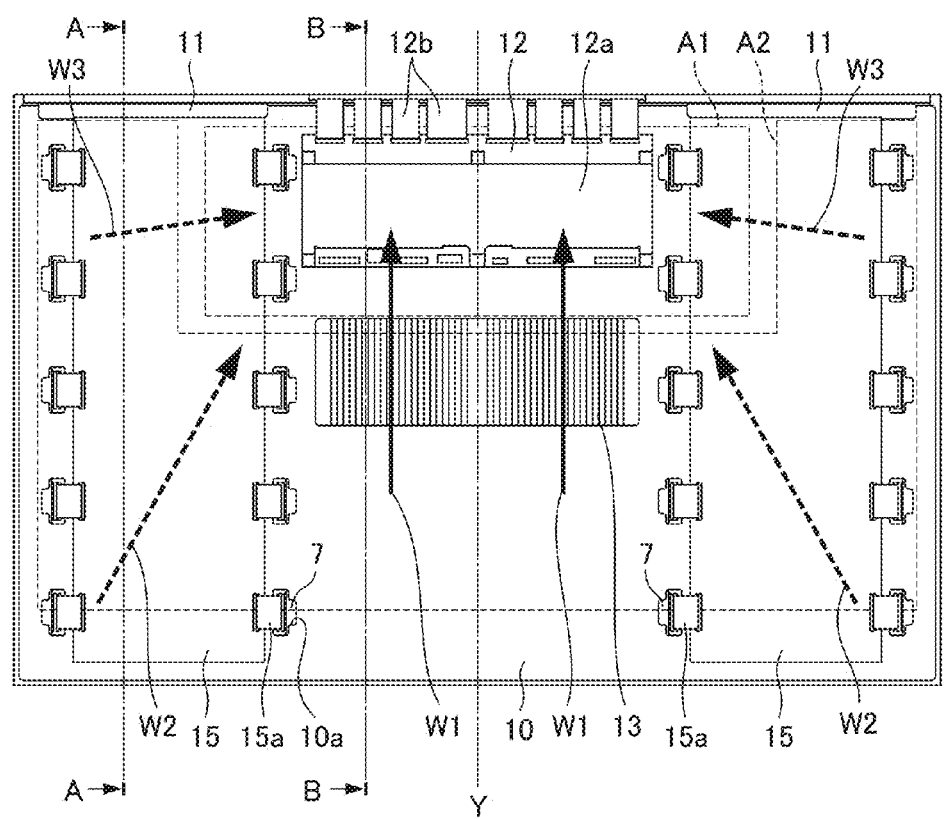
FIG. 3 is a rear view illustrating an image display apparatus without a chassis.

FIG. 3 is a rear view illustrating the image display apparatus of the present embodiment which the chassis 16 is removed therefrom. The display control substrate 12 and a plurality of LED driver substrates 15 provided on both left and right sides thereof are arranged on the rear side of the LED heat sink 10. The component-mounting surface of the display control substrate 12 faces toward the rear face of the image display apparatus so as to face the fan 19, whereas the component non-mounting surface of the display control substrate 12 faces toward the display panel side so as to face the LED heat sink 10. Two LED driver substrates 15 are arranged symmetrically to the left and right with respect to the center line Y of a vertical direction passing through the central portion of the display control substrate 12. The LED has characteristics of brightness fluctuation due to temperature. Brightness decreases if temperature is high, whereas brightness increases if temperature is low. When a non-uniform temperature distribution is imposed on an LED light emitting surface, irregularity in brightness may be caused, resulting in an adverse effect on image quality. When air cooling is not performed in the configuration shown in FIG. 3, the temperature distribution of the LED heat sink 10 is made such that the temperature of a range A1 is higher than that of a range A2 as shown by a broken line frame. The range A1 includes the display control substrate 12 and its peripheral area and a partial area of the LED driver substrates 15. The range A2 includes an area other than the range A1. The temperature of the air sucked from the vent holes of the chassis 16 is as low as that of the external air immediately after sucking the air. Then, the air is gradually warmed within the interior of the apparatus and thus the temperature of the air rises. Furthermore, the temperature of the range A1 becomes higher by heat generated from the display control substrate 12. For example, when only one side of a plurality of LED driver substrates 15 which is positioned at the left and right of the display control substrate 12 is present, air readily flows over the surface of the LED heat sink 10 on which no LED driver substrate 15 is present, resulting in acceleration of heat dissipation. At this time, if only a part of the LED heat sink 10 is cooled down excessively, a deviation in temperature distribution occurs. In other words, the temperature difference becomes undesirably large as compared with the case where the LED driver substrates 15 are arranged symmetrically to the left and right. Thus, by arranging the LED driver substrates 15 on the display control substrate 12 symmetrically to the left and right with respect to the center line Y, heat dissipation of the LED heat sink 10 is equalized between the left and right. Consequently, irregularity in brightness may be suppressed.

The auxiliary heat sink 13 is fixed on the lower side of the display control substrate 12. Heat generated from the LED substrate 7 is transmitted to the LED heat sink 10 and is dissipated from the auxiliary heat sink 13 which is positioned at the substantially central portion of the rear face of the image display apparatus into the air. In this manner, the cooling efficiency by means of the LED heat sink 10 can be further improved. The display control substrate 12 is connected to the liquid crystal panel 1 using a plurality of FPCs (Flexible Printed Circuits) 12b at the top thereof and is covered by a cover 12a from the rear side. The cover 12a serves to shield electromagnetic waves generated by the display control substrate 12 and also serves as a heat sink that performs heat dissipation of mounting components. The LED driver substrate 15 is formed as a rectangular plate and is connected to the LED substrate 7 using a plurality of flexible connection members, for example, FFCs (Flexible Flat Cables) 15a so as to supply electrical power and an electrical signal to the LED substrate 7.

Air that has flowed inside from the vent holes 16a, 16b, and 16c shown in FIG. 1B flows along the arrows W1, W2, and W3 shown in FIG. 3 and then is discharged from a plurality of fans 19 into the external of the apparatus to thereby achieve cooling of the backlight. Air that has flowed inside from a plurality of vent holes 16a ascends along the LED heat sink 10 by passing through the arrow W1 shown by the solid line as shown in FIG. 3 to thereby pass the auxiliary heat sink 13 and the cover 12a. On the other hand, air that has flowed inside from a plurality of vent holes 16b and 16c passes between each of the LED driver substrates 15 and the LED heat sink 10 by passing through the arrows W2 and W3 by the dotted line as shown in FIG. 3. The FFC 15a is arranged along the vertical direction of the image display apparatus at the long side of each LED driver substrate 15. The vent holes 16a shown in FIG. 1B are arranged in a direction orthogonal to the arrangement direction of the FFCs 15a. As shown by the arrow W1 in FIG. 3, the flow direction of air from the vent holes 16a is substantially parallel to the arrangement direction of the FFCs 15a. In other words, the structure in which air resistance is not increased by preventing the flow of air due to the arrangement of the FFCs 15a is employed, resulting in no adverse effect on heat dissipation of backlight.

Figure 4A:
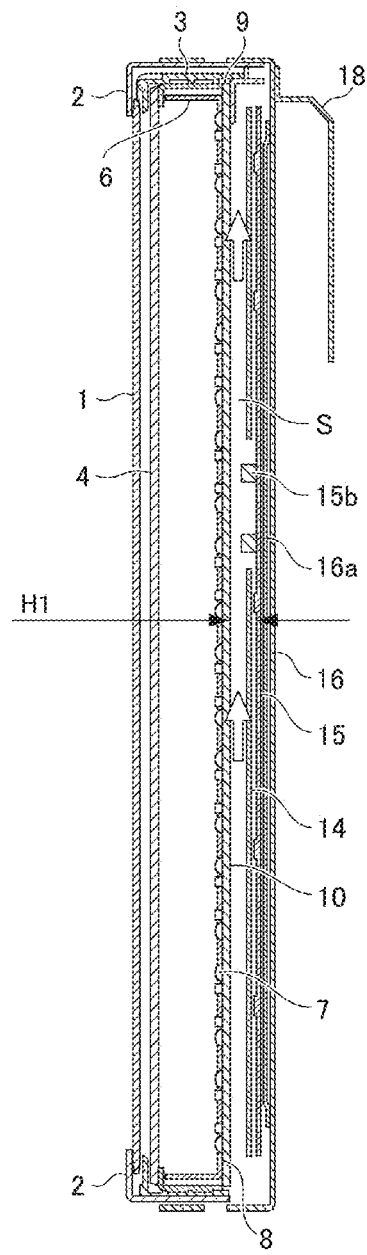
FIG. 4A is a cross-sectional view taken along the line A-A of FIG. 3.
Figure 4B:
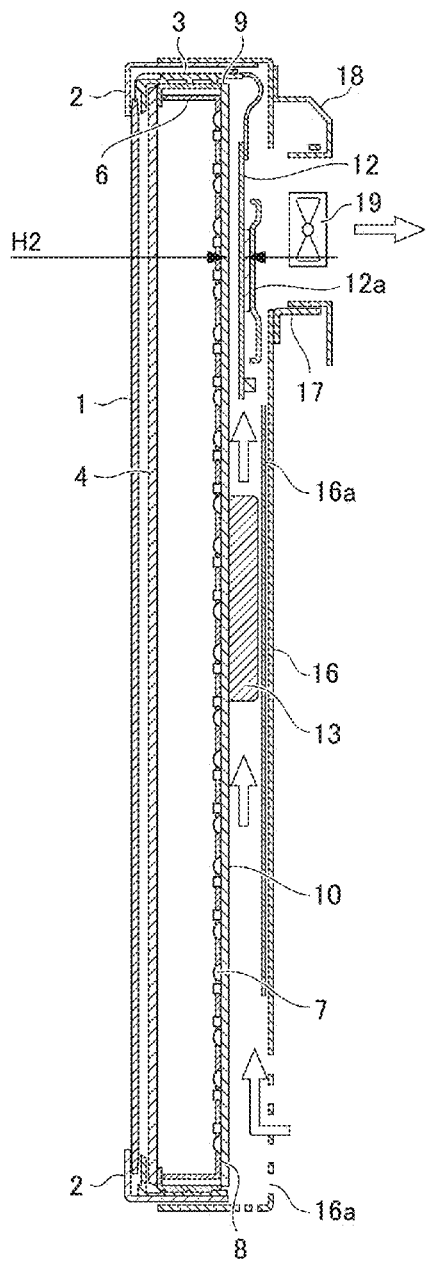
FIG. 4B is a cross-sectional view B taken along the line B-B of FIG. 3.

Next, a description will be given of a heat-dissipation passage in the image display apparatus. FIG. 4A is a cross-sectional view taken along the line A-A of FIG. 3 and shows the cross-section of the portion where the LED driver substrate 15 is disposed. FIG. 4B is a cross-sectional view taken along the line B-B of FIG. 3 and shows the cross-section of the portion where the fan 19 is disposed. As described above, the LED driver substrate 15 is arranged facing to the LED heat sink 10, and the component-mounting surface of the LED driver substrate 15 on which a plurality of mounting components 15b is mounted faces the LED heat sink 10. Also, the component non-mounting surface thereof faces the chassis 16. A space S is formed between the LED heat sink 10 and the LED driver substrate 15. A plurality of vent holes 16b shown in FIG. 1B is arranged along a direction parallel to the center line Y of the vertical direction shown in FIG. 3. Air that has flowed inside from these vent holes 16b flows upward through the space S as shown by the arrow of FIG. 4A. Air flow leads to heat dissipation from the LED heat sink 10 and the LED driver heat sink 14.

Also, a plurality of the vent holes 16a shown in FIG. 1B is arranged along a direction orthogonal to the center line Y of the vertical direction shown in FIG. 3. In the cross-section shown in FIG. 4B, air that has flowed inside from a plurality of vent holes 16a formed on the lower part of the chassis 16 flows upward as shown by the arrow and passes the LED heat sink 10 and the auxiliary heat sink 13. The air further passes the component-mounting surface of the display control substrate 12 and the upper part of the cover 12a and is discharged from the air blow fan 19. Thus, air flow leads to heat dissipation from the LED heat sink 10 and the auxiliary heat sink 13.

Next, a description will be given of the arrangement of the LED driver substrate 15 and the display control substrate 12 with respect to the LED heat sink 10. As shown in FIG. 4A, the spacing between the LED heat sink 10 and the LED driver substrate 15 is denoted by H1. In FIG. 4B, the spacing between the LED heat sink 10 and the display control substrate 12 is denoted by H2. In the present embodiment, the value of H1 is designed to be greater than that of H2. In other words, the display control substrate 12 is arranged closer to the LED heat sink 10 as compared with the LED driver substrate 15. In this manner, even when the fan 19 is arranged on the rear face of the display control substrate 12, the distance between the LED heat sink 10 and the fan 19 can be shortened. Also, air flowing through the space S shown in FIG. 4A can pass the component-mounting surface side of the display control substrate 12 without resistance, resulting in no adverse effect on intake resistance of the fan 19.

The greater the difference between the spacing H1 and the spacing H2, the easier air can flow from the LED driver substrate 15 to the display control substrate 12 with less resistance. It is preferable that the value of H1 is more than twice the value of H2 as shown by the following inequality:

$$H1 \geq 2 \times H2$$

If the value of H2 is set to be small and the display control substrate 12 is excessively closer to the LED heat sink 10, it becomes difficult to dissipate the heat generated by the LED heat sink 10 into air. Thus, in the present embodiment, the value of H2 is set to 5 mm.

In the first embodiment, the component-mounting surface of the LED driver substrate 15 faces the LED heat sink 10 and the fan 19 is arranged facing to the component-mounting surface of the display control substrate 12. The display control substrate 12 is arranged on the front side as compared with the LED driver substrate 15 and the fan 19 is arranged on the rear side of the display control substrate 12, whereby thinning the apparatus can be realized. Also, the LED driver substrate 15 is arranged on the rear side as compared with the display control substrate 12, the component-mounting surface of the LED driver substrate 15 can face the LED heat sink 10 and face toward the front side. In this manner, the heat from both the LED heat sink 10 and the LED driver substrate 15 can be dissipated into air. The space through which air flows smoothly is ensured so that thinning the apparatus can be realized while maintaining a heat-dissipation performance.

The present invention is also applicable to the case where the component-mounting surface of each of the display control substrate 12 and the LED driver substrate 15 is defined as a main mounting surface and the component non-mounting surface thereof is defined as a sub-mounting surface. For example, when mounting components such as electronic components are mounted on both sides of a substrate, a substrate surface having a larger total area or a larger total volume of mounting components is defined as the main mounting surface and a substrate surface having a smaller total area or a smaller total volume of mounting components is defined as the sub-mounting surface.

A power source circuit substrate (not shown) for supplying power to the display control substrate 12 and the LED driver substrate 15 is provided, for example, on the rear face of the chassis 16 and is arranged in a space below the fan 19. The power source circuit substrate is covered by a resin back-cover member. In the present embodiment, a display control substrate for a display panel is exemplified as a first circuit substrate of which the component-mounting surface is arranged at a position facing the fan side and a drive substrate for driving a light source unit is exemplified as a second circuit substrate of which the component-mounting surface is arranged to face the display unit side. The present invention is not limited thereto, but the functions of the first circuit substrate and the second circuit substrate are changeable as appropriate depending on device specification.

(Second Embodiment)

Figure 5:
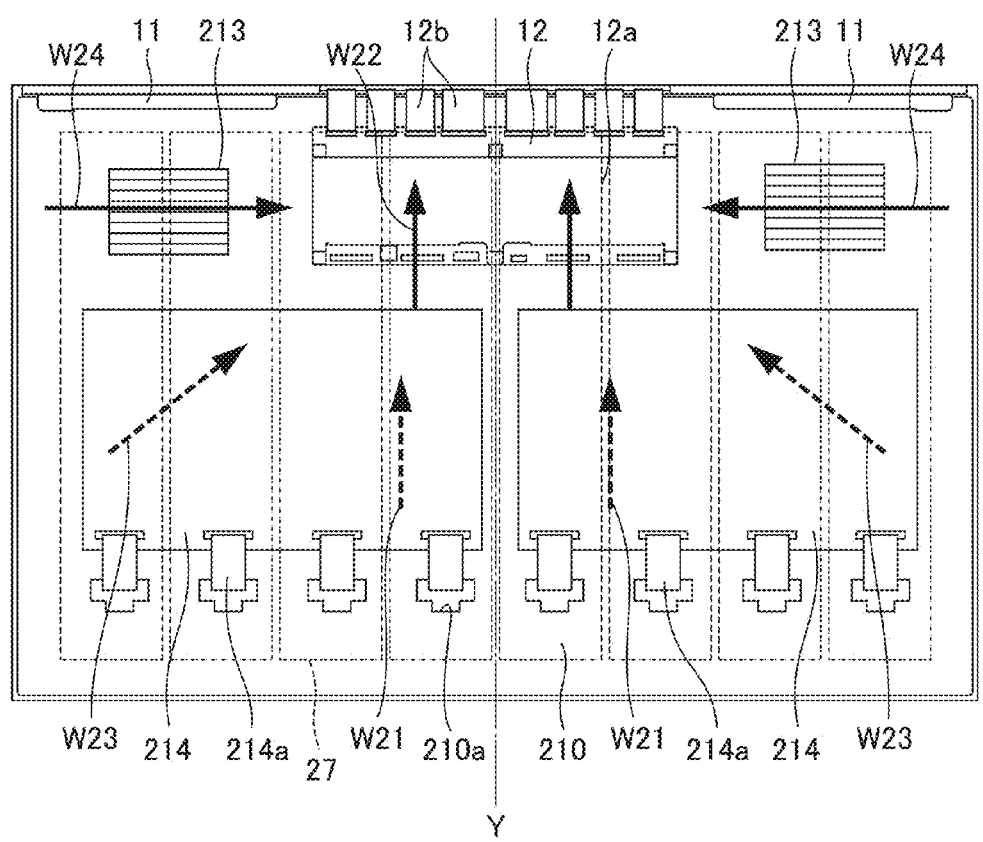
FIG. 5 is a rear view illustrating an image display apparatus according to a second embodiment of the present invention without a chassis.

Next, a description will be given of a second embodiment of the present invention. In the following, components corresponding to or similar to those in the first embodiment are designated by the same reference numerals, and therefore, its explanation will be omitted. A description will be given mainly of the difference from the first embodiment. A description of the embodiments to be described below will be omitted in the same way. FIG. 5 is a rear view illustrating an image display apparatus according to the second embodiment with a chassis removed therefrom.

In the second embodiment, the shape and arrangement of LED driver substrates are different from those in the first embodiment shown in FIG. 3. A plurality of LED driver substrates 214 are arranged below the display control substrate 12. Two LED driver substrates 214 that are arranged symmetrically to the left and right with respect to the center line Y of a vertical direction of the image display apparatus are connected to an LED substrate 27 via a plurality of holes 210a formed in an LED heat sink 210 using a plurality of FFCs 214a. The LED substrate 27 is in a rectangular strip shape as shown by the broken line frame in FIG. 5 and is configured by eight pieces. Consequently, a row of the FFCs 214a is arranged along the horizontal direction at a position closer to the lower part of the image display apparatus.

In the positional relationship between the display control substrate 12 and the LED driver substrate 214 with respect to the LED heat sink 210, the display control substrate 12 is arranged closer to the LED heat sink 210 than the LED driver substrate 214. Air that has flowed inside from a plurality of vent holes 16a positioned below the image display apparatus passes between the LED driver substrate 214 and the LED heat sink 210 as shown by the arrows W21 and W22 in FIG. 5 to thereby flow toward the display control substrate 12. Also, air that has flowed inside from the side surface parts on the left and right sides of the image display apparatus, i.e., air that has flowed inside from the vent holes 16b and 16c shown in FIG. 1B flows along the arrows W23 and W24 in FIG. 5. The flow direction of air that flows along the arrow W24 is substantially parallel to the arrangement direction of the FFCs 214a and is introduced to the display control substrate 12. A plurality of fans (not shown) serving as fans is arranged on the rear side of the display control substrate 12 as described with reference to FIG. 3 so as to discharge air to the external of the apparatus. As viewed from the opposite side from the display face, each of auxiliary heat sinks 213 is arranged at a substantially intermediate position between the display control substrate 12 and each of the vent holes 16b and 16c. Further efficiently heat dissipation from the LED heat sink 210 is realized by providing these auxiliary heat sinks 213.

According to the second embodiment, thinning the apparatus can be realized while maintaining a heat-dissipation performance in the configuration in which a plurality of LED driver substrates 214 is arranged below the display control substrate 12.

(Third Embodiment)

Figure 6:
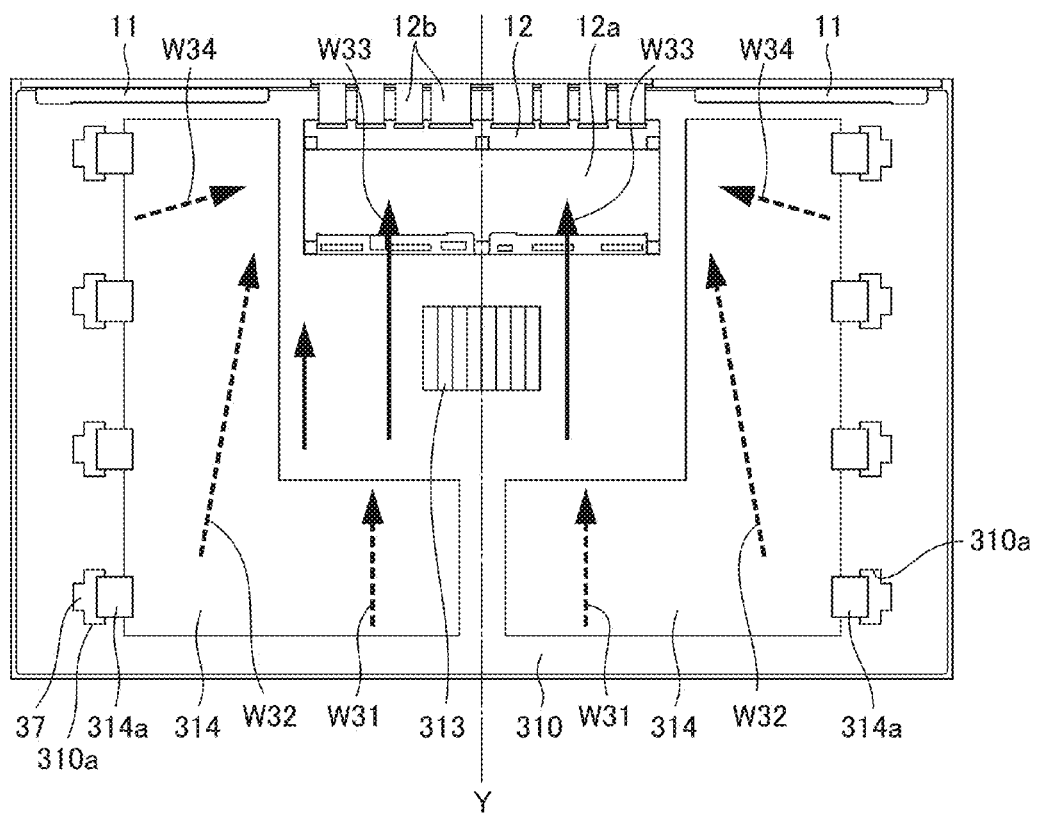
FIG. 6 is a rear view illustrating an image display apparatus according to a third embodiment of the present invention without a chassis.
Figure 7:
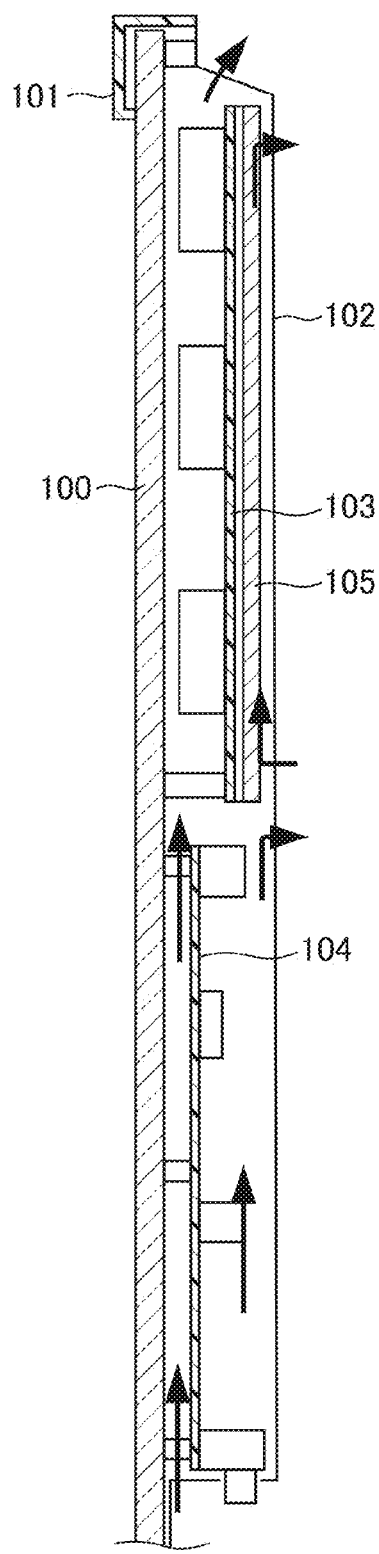
FIG. 7 is a cross-sectional view illustrating the heat dissipating structure of a conventional image display apparatus.

Next, a description will be given of a third embodiment of the present invention. FIG. 6 is a rear view illustrating an image display apparatus according to the third embodiment with a chassis removed therefrom.

A plurality of LED driver substrates 314 has an L-shaped plate and is arranged laterally to the right and left sides of the display control substrate 12 and below the display control substrate 12. The LED driver substrates 314 are arranged symmetrically to the left and right with respect to the center line Y of the vertical direction of the image display apparatus. The LED substrates 37 are connected to the LED driver substrate 314 via a plurality of holes 310a formed in an LED heat sink 310 using a plurality of FFCs 314a.

Air that has drawn from a plurality of vent holes 16a positioned below the chassis 16 shown in FIG. 1B passes between the LED driver substrate 314 and the LED heat sink 310 along the arrows W31 and W32 in FIG. 6 to thereby flow toward the display control substrate 12 along the arrow W33. Also, air that has been taken from a plurality of vent holes 16b and 16c positioned on the left and right sides of the chassis 16 flows along the arrow W34. A plurality of FFCs 314a is arranged along the vertical direction of the image display apparatus. In other words, the direction along which a plurality of the FFCs 314a is arranged is a direction orthogonal to the arrangement direction of a plurality of vent holes 16a positioned closer to the lower surface part of the image display apparatus. Thus, the flow direction of air that has flowed inside from the vent holes 16a is substantially parallel to the arrangement direction of the FFCs 314a, which may not cause any air resistance. Consequently, efficiently heat dissipation from the LED heat sink 310 and the LED driver substrate 314 is realized. An auxiliary heat sink 313 is arranged at a substantially intermediate position between a plurality of vent holes 16a and the fan 19 (not shown), and thus, efficiently heat dissipation from the LED heat sink 310 is realized.

According to the third embodiment, thinning the apparatus may be realized while ensuring the part mounting area of the LED driver substrate 314 and maintaining a heat-dissipation performance.

While, in the above embodiments, a description has been given by taking an example of a pair of LED driver substrates, various embodiments such as a configuration of multiple pairs of LED driver substrates arranged symmetrically to the left and right may be made.

Aspects of the present invention can also be realized by a computer of a system or apparatus (or devices such as a CPU or MPU) that reads out and executes a program recorded on a memory device to perform the functions of the above-described embodiments, and by a method, the steps of which are performed by a computer of a system or apparatus by, for example, reading out and executing a program recorded on a memory device to perform the functions of the above-described embodiments. For this purpose, the program is provided to the computer for example via a network or from a recording medium of various types serving as the memory device (e.g., computer-readable medium).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-062250 filed on Mar. 19, 2012, and Japanese Patent Application No. 2013-013830 filed on Jan. 29, 2013 which are hereby incorporated by reference herein in their entirety.

What is claimed is:

1. A display apparatus comprising:
a display unit;
a chassis member provided at the rear side of the display unit;
a fan attached to the chassis member;
a first circuit substrate that is provided between the display unit and the chassis member and of which the component-mounting surface is arranged at a position facing the fan side; and
a second circuit substrate that is provided between the display unit and the chassis member and of which the component-mounting surface is arranged to face the display unit side.

2. The display apparatus according to claim 1, wherein the spacing between the first circuit substrate and the display unit is smaller than the spacing between the second circuit substrate and the display unit.

3. The display apparatus according to claim 2, wherein the display unit further includes a display panel, a light source unit that irradiates the display panel with light, and a heat radiating portion that dissipates heat generated by the light source unit, and
wherein the spacing between the first circuit substrate and the heat radiating portion is smaller than the spacing between the second circuit substrate and the heat radiating portion.

4. The display apparatus according to claim 3, wherein the light source unit further includes a surface light source unit that is located on the rear side of the display panel and emits light, and the heat radiating portion is a heat sink that dissipates heat generated by the surface light source unit.

5. The display apparatus according to claim 4, wherein the surface light source unit includes a substrate with a plurality of light-emitting elements mounted thereon and the heat sink is brought into thermal contact with the component non-mounting surface of the substrate with the plurality of light-emitting elements.

6. The display apparatus according to claim 1, wherein the display apparatus includes the second circuit substrate in plural, and the component-mounting surfaces of the second circuit substrates are arranged symmetrically about the center line of a vertical direction passing through the central portion of the first circuit substrate and arranged so that the component-mounting surfaces face the display unit side.

7. The display apparatus according to claim 1, wherein a plurality of vent holes are formed on a side part or a lower part of the chassis member, and the second circuit substrate is arranged at the side of or below the first circuit substrate.

8. The display apparatus according to claim 7, wherein the plurality of vent holes are formed on the chassis member along a direction orthogonal to the center line of the vertical direction, and a plurality of connection members that connects the light source unit provided in the display unit with the plurality of second circuit substrates is arranged along a direction parallel to the center line of the vertical direction.

9. The display apparatus according to claim 7, wherein the plurality of vent holes are formed on the chassis member along a direction parallel to the center line of the vertical direction, and a plurality of connection members that connects the light source unit provided in the display unit with the plurality of second circuit substrates is arranged along a direction orthogonal to the center line of the vertical direction.

10. The display apparatus according to claim 7, wherein, when the display apparatus is viewed from the opposite side to the display face of the display panel, a heat radiating portion for dissipating heat generated by the display unit includes an auxiliary heat sink between the plurality of vent holes and the fan.

11. The display apparatus according to claim 7, wherein the plurality of vent holes are formed on the side part of the chassis member along a direction parallel to the center line of the vertical direction, the second circuit substrate is arranged at the side of the first circuit substrate.

12. The display apparatus according to claim 7, wherein the plurality of vent holes are formed on the side part of the chassis member along a direction parallel to the center line of the vertical direction and are formed on the low part of the chassis member along a direction orthogonal to the center line of the vertical direction, the second circuit substrate is arranged at the side of the first circuit substrate.

13. The display apparatus according to claim 7, wherein the plurality of vent holes are formed on the low part of the chassis member along a direction orthogonal to the center line of the vertical direction, the second circuit substrate is arranged below the first circuit substrate.

14. The display apparatus according to claim 7, wherein the plurality of vent holes are formed on the low part of the chassis member along a direction orthogonal to the center line of the vertical direction and are formed on the side part of the chassis member along a direction parallel to the center line of the vertical direction, the second circuit substrate is arranged below the first circuit substrate.

15. The display apparatus according to claim 7, wherein the spacing between the first circuit substrate and the display unit is smaller than the spacing between the second circuit substrate and the display unit.

16. The display apparatus according to claim 15, wherein air that has flowed inside from the plurality of vent holes passes through the upper part of the component-mounting surface of the first circuit substrate and is discharged from the vent holes.

17. The display apparatus according to claim 15, wherein air that has flowed inside from the plurality of vent holes passes through the upper part of the component-mounting surface of the second circuit substrate and is discharged from the vent holes.

18. The display apparatus according to claim 15, wherein air that has flowed inside from the plurality of vent holes passes through the upper part of the component-mounting surface of the first and second circuit substrates and is discharged from the vent holes.

19. The display apparatus according to claim 1, wherein the display unit comprises a display panel and a light source unit which irradiates the display panel with light, the first circuit substrate is a display control substrate that performs display control of the display panel, and the second circuit substrate is a drive substrate that drives the light source unit.

20. The display apparatus according to claim 1, wherein mounting components are mounted on both sides of the first circuit substrate, and the component-mounting surface of the first circuit substrate having a larger total area or a larger total volume of the mounting components is defined as a main mounting surface.

21. The display apparatus according to claim 1, wherein mounting components are mounted on both sides of the second circuit substrate, and the component-mounting surface of the second circuit substrate having a larger total area or a larger total volume of the mounting components is defined as a main mounting surface.

22. The display apparatus according to claim 1, wherein mounting components are mounted on both sides of the first and second circuit substrates, respectively, and each of the component-mounting surfaces of the first and second circuit substrates having a larger total area or a larger total volume of the mounting components is defined as a main mounting surface.

* * * * *